April 8, 1958 A. R. DENZ 2,830,257

TEMPERATURE-COMPENSATED DIRECT-CURRENT TRANSISTOR AMPLIFIER

Filed July 2, 1956 2 Sheets-Sheet 1

April 8, 1958 A. R. DENZ 2,830,257

TEMPERATURE-COMPENSATED DIRECT-CURRENT TRANSISTOR AMPLIFIER

Filed July 2, 1956 2 Sheets-Sheet 2

United States Patent Office 2,830,257

Patented Apr. 8, 1958

2,830,257

TEMPERATURE-COMPENSATED DIRECT-CURRENT TRANSISTOR AMPLIFIER

Arthur R. Denz, Chicago, Ill., assignor to International Telephone and Telegraph Corporation, New York, N. Y., a corporation of Maryland Application July 2, 1956, Serial No. 595,378

6 Claims. (Cl. 323—68)

This invention relates to a temperature-compensated direct-current amplifier, and more particularly to a direct-current amplifier employing a transistor. Its object is to provide a simple and effective direct-current transistor amplifier which has zero output current at cutoff, irrespective of variations of the transistor temperature.

When a transistor is operated with the usual inverse collector bias and with current flow through the emitter diode cut off, current which increases exponentially with temperature flows through the collector diode. When current does flow through the emitter diode, the current flow through the collector diode is the sum of the cut-off current and the current which is equal to the emitter current multipled by the current-gain factor, alpha.

When a transistor is used as the current-amplifying member of a direct-current amplifier, the cutoff current is a component of the output, unless it is balanced out or compensated for in some manner. With junction transistors it is usually necessary to use a grounded emitter rather than a grounded-base configuration in a direct-current amplifier, to obtain useful current gain. Therefore, except when the emitter diode is biased to cutoff, the cutoff component of the output current is increased by the well-known regenerative characteristic of a grounded-emitter amplifier. Arrangements are known using two or more transistors, along with other circuit elements to compensate for variations of the cutoff current with temperature over the entire operating range of the amplifier. Some of these arrangements involve careful design to obtain the required result.

However, if the requirements for the amplifier are such that the cutoff current, even though regenerated by the use of a grounded-emitter configuration, may be tolerated in the output when input current is flowing; but the output must be zero when the input current is cut off, the prior arrangements are unnecessarily complicated and expensive.

According to the invention, a direct-current amplifier is provided using a single transistor, and a circuit arrangement such that the current which flows in the collector diode when the emitter diode is at cutoff, is balanced by current flow in a diode having a temperature characteristic similar to that of the collector diode.

In the preferred form of the invention, the collector diode and balancing diode are in adjacent arms of a bridge, a resistor with a sliding tap forms the other two arms, the D. C. supply source is connected in one diagonal, and the load is connected in the other diagonal.

The foregoing and other objects and features of this invention and the manner of attaining them will become more apparent and the invention itself will be best understood, by reference to the following description of an embodiment of the invention taken in conjunction with the accompanying drawings comprising Figs. 1 to 4, wherein.

It has been chosen to disclose the invention as applied to a multi-channel telephone transmission system, with transmission over an open two-wire line.

Figures 1, 3, 4:
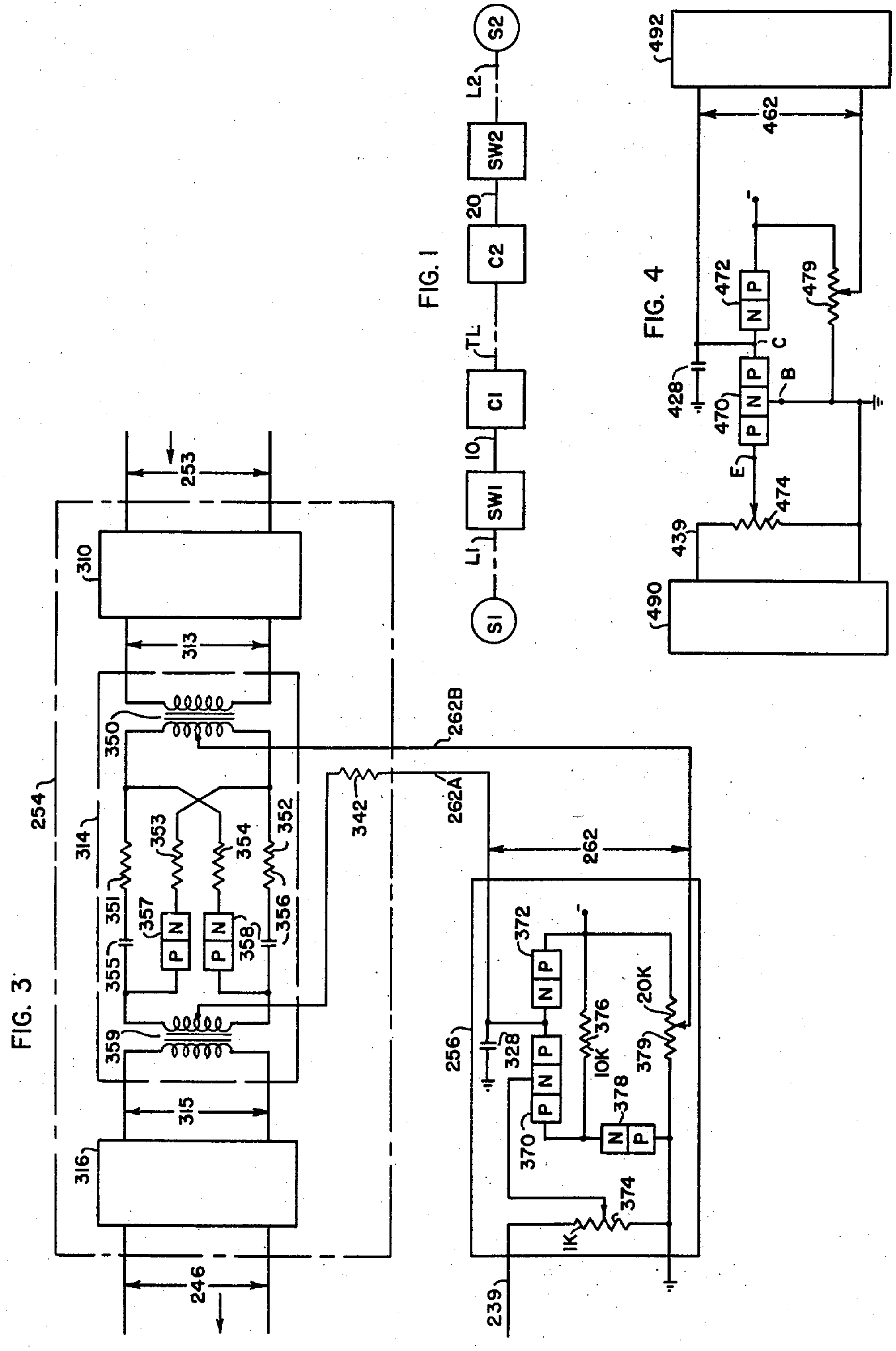
Fig. 1 shows a block diagram of a telephone system including carrier equipment.
Fig. 3 shows the details of a portion of the equipment of the carrier terminal including the D. C. amplifier.
Fig. 4 shows an alternative form of the amplifier.

Referring to Fig. 1, a switchboard SW1 at a first exchange has subscriber lines such as line L1 to station S1, and connections through conductor group 10 to carrier terminal equipment C1. The second exchange includes a similar switchboard SW2, lines such as L2 to station S2 and carrier terminal equipment C2 connected to the switchboard by conductor group 20. An open two-wire transmission line TL extends between the carrier equipments C1 and C2.

Figure 2:
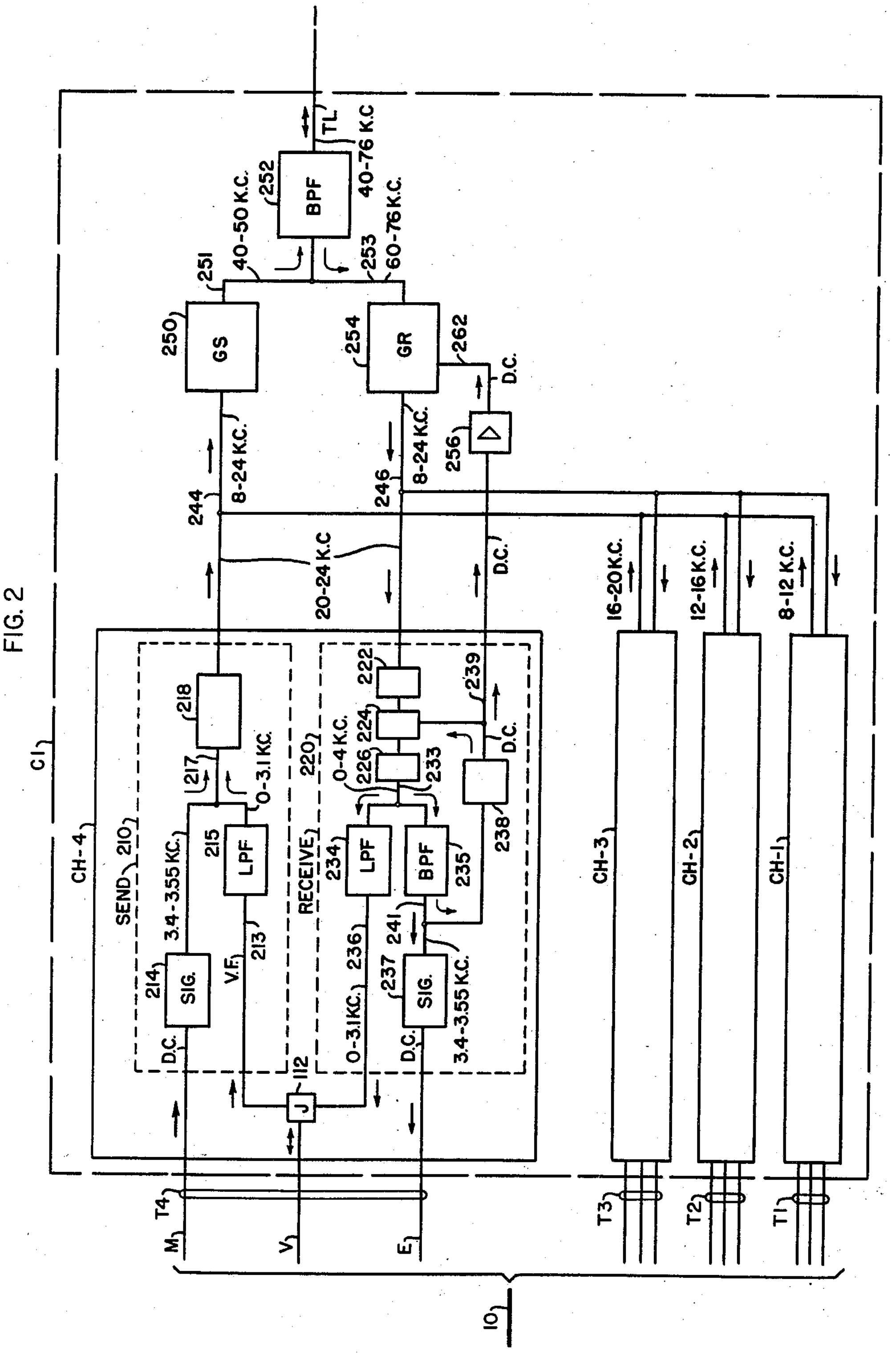
Fig. 2 shows a block diagram of a carrier terminal of Fig. 1.

Fig. 2 shows a block diagram of the carrier terminal equipment C1. Conductor group 10 includes four trunks T1 to T4, each comprising the direct current signalling leads M and E and a voice-signal pair V. The trunks are connected to the respective channel equipments CH–1 to CH–4. As shown for channel 4, each channel equipment includes send equipment 210, receive equipment 220, and a balanced junction 112. The junction 112 includes a hybrid transformer and a balancing network for coupling the conjugate outgoing line 213 and incoming line 236 to the two-way line V. The voice signals on line 213 are coupled through low-pass filter 215 to line 217. The D. C. signals from line M modulate an oscillator in the signal equipment 214, which produces a pilot signal applied to line 217. This pilot signal is shifted between 3400 cycles and 3550 cycles, while the voice signal output from filter 215 is limited to a high of 3100 cycles. The voice and pilot signals are combined on line 217 and passed through a modulator and band-pass filter 218 to produce signals in the 20–24 kilocycle channel at the output to line 244. The outgoing signals from channel equipments CH–1 to CH–4, in separate frequency channels as indicated, are supplied in multiple to line 244 giving a four-channel band of 8 to 24 kilocycles. These signals then pass through amplifiers, modulators and band pass filters in the group-send equipment 250, where they are converted to the 40 to 56 kilocycle band, then passing over line 251 and through a group-line filter 252 to the transmission line TL.

Incoming signals on line TL, in the 60 to 76 kilocycle band, are coupled through the group line filter 252, over line 253, through the group receive equipment 254, where they are converted to signals in the 8 to 24 kilocycle band, thence to line 246 connected in multiple to the incoming lines of the channel equipments CH–1 to CH–4. The band is divided into respective channels, as indicated, by band-pass filters such as filter 222 in the channel equipment CH–4.

From the filter 222 the signals pass through an automatic gain regulator 224, and the amplifying and demodulating equipment 226, to line 233. The pilot and voice signals are then separated by the filters 234 and 235, the voice signals, which are under 3100 cycles, passing through the low-pass filter 234, while the pilot signals, which are at 3400 or 3550 cycles, pass through the band-pass filter 235. The voice signals on line 234 are then coupled through junction 112 to line V. A frequency discriminator in signalling equipment 237 converts the pilot signal to a D. C. signal on line E.

The pilot signal on line 241 is also coupled to a control amplifier and detector in equipment 238, supplying a D. C. signal on line 239 which is proportional to the amplitude of the pilot signal on line 241, to control the regulator 224. Equipment 238 also includes an alarm circuit for indicating when the pilot signal falls below a given level. Each channel equipment includes a regulator similarly controlled. The control signal from channel 4 is further amplified by a group-control amplifier 256 for regulation in the group-receiving equipment 254.

Referring now to Fig. 3, the group receiving equipment 254 and the regulation-control amplifier 256 are shown partly in circuit detail.

Signals on line 253 from the group line filter pass through band-pass filter 310, regulator 314, and the group demodulating and amplifying equipment 316, and thence over line 246 to the receiving band-pass filters of the four channels in parallel.

The regulator 314 comprises a lattice network of resistors 351, 352, 353, and 354, blocking condensers 355 and 356, and diodes 357 and 358 in a balanced line section between transformer 350 and transformer 359, for introducing equal attenuation over the entire band according to the level of pilot signal 4. The regulator is controlled by the D. C. output on line 262 from amplifier 256 with wire 262A connected through resistor 342 to the center tap of transformer 359 and wire 262B connected to the center tap of transformer 350. The D. C. flow through the diodes 357 and 358 controls the A. C. loss of the regulator 314.

When the control signal from channel 4 is below a given level on line 239, it is desired that there be a minimum signal loss in regulator 314, and that therefore the D. C. output current from amplifier 256 to line 262 be zero. As the control signal on line 239 increases above the given level, the D. C. current on line 262 increases to increase the loss in regulator 314, thereby decreasing the signal level on line 315. Since the control signal level varies according to the level of the pilot signal 4 included in the output of the regulator 314, the system will stabilize with the current on line 262 which produces the loss in regulator 314 necessary to establish the corresponding input signal on line 239. Therefore it may be seen that the output of amplifier 256 to line 262 should increase as the input on line 239 increases above the given level, but that the exact relation between output and input is not critical.

The amplifier 256 comprises a PNP junction transistor 370, which may be type 2N44. A resistor 374 is connected from the input line 239 to ground, with a sliding tap of the resistor connected to the base terminal. A regulated one-volt negative potential is obtained at the emitter terminal by connecting it to the junction of a resistor 376 and a diode 378, which are connected in series between the negative terminal of the D. C. power supply and ground. Diode 378 may be type 6003. The control signal on line 239 has a negative potential to ground. The slider of resistor 374 is adjusted so that input current flow through the emitter diode of transistor 370 cuts off at the given signal level on line 239.

When the input signal is below the given level, the transistor is cut off by inverse bias of the emitter diode; but with the normal inverse bias potential applied to the collector terminal, cutoff current flows through the collector diode. This cutoff current increases exponentially as the temperature increases.

According to the invention, a junction diode 372, which may be a type 1N91, is connected between the collector terminal and the negative supply terminal. This balancing diode should have a variation of inverse current with temperature similar to that of the cutoff current of the collector diode of the transistor. A resistor 379 with a sliding tap is connected between the negative supply terminal and ground, forming a bridge comprising the two ends of resistor 379, diode 372, and the collector diode. The output load, comprising the D. C. path through regulator 314 in series with resistor 342, is connected between the collector terminal and the tap of resistor 379. The slider of resistor 379 is adjusted to obtain zero output current at cutoff, and remains balanced for temperature variation over a wide range.

When the input control signal exceeds the given level, current flows through the emitter diode in its forward direction, and output current flows to line 262. This output current is approximately equal to the input current at the base terminal multipled by the current-gain factor, beta. Condenser 328 filters any A. C. from the amplifier output.

Fig. 4 shows an alternative form of the amplifier using a transistor 470 with the base terminal grounded. The emitter terminal is connected to a sliding tap of a resistor 474 connected between ground and the input line 439 from a D. C. signal source 490. A junction diode 472 is connected between the collector terminal and the negative supply terminal, and a resistor 479 with a sliding tap is connected between the negative supply terminal and ground. A load 492 is connected by line 462 from the collector terminal to the tap of resistor 479. Condenser 428 filters A. C. from the output.

Operation is similar to that of amplifier 256. The transistor is cut off when the input signals on line 439 are at a negative potential. The output current is then adjusted to zero by the slider of resistor 479. When the input signals on line 439 are positive, the output current is approximately the input current at the emitter terminal multipled by the current gain factor, alpha.

While I have described above the principles of my invention in connection with specific apparatus, it is to be clearly understood that this description is made only by way of example and not as a limitation to the scope of my invention.

I claim:

1. A direct-current transistor amplifier comprising a transistor having an emitter member, a collector member, and a common base member, with emitter, base, and collector terminals connected to the respective members, the emitter and base members comprising an emitter diode, the collector and base members comprising a collector diode, a balancing diode having a variation of inverse current with temperature similar to that of the collector diode when no current is flowing through the emitter diode, supply source means for driving a direct current through the balancing diode and the collector diode in series in the inverse direction, an input circuit path through the emitter diode, an output circuit path, means including a circuit arrangement for balancing current flow in the balancing diode against current flow in collector diode for obtaining substantially zero output current at any temperature within a given range when no current is flowing through the emitter diode in its forward direction, and means responsive to input current flow through the emitter diode in its forward direction for causing corresponding current flow in the output circuit path.

2. In a direct-current transistor amplifier according to claim 1, a four-terminal bridge, with the said collector diode included in one arm, the said balancing diode in another arm, resistors in the remaining arms, the said output circuit path in the diagonal from the collector terminal to the opposite terminal, and the said supply source means in the other digonal.

3. In a direct-current transistor amplifier according to claim 1, means including a crystal diode for establishing a regulated potential of one polarity between the said emitter terminal and a reference ground, and a source of direct-current input signals of said one polarity to ground coupled to the said base terminal, whereby current flows through the emitter diode in its forward direction when the signal potential at the base terminal exceeds the regulated potential at the emitter terminal.

4. In combination with a direct-current transistor amplifier according to claim 1, a transmission path, a source of alternating-current signals including a pilot signal coupled to the transmission path, a regulator included in the transmission path for reducing the variation of signal level according to the level of the pilot signal, means for obtaining a direct-current control signal which varies in value according to the level of the pilot signal at a selected point in the transmission path, means coupling the control signal to the said input circuit path, and means coupling the said output circuit path to the regulator for controlling the amount of loss to the alternating current signals passing through the regulator.

5. In a combination according to claim 4, means responsive to the said control signal having a value below a given level for blocking forward current flow through the said emitter diode, and means responsive to the control signal having a value above the given level for causing current to flow through the emitter diode in its forward direction.

6. A combination according to claim 4, wherein the said alternating-current signals pass through the said regulator before the said selected point in the transmission path.

No referencies cited.